(12) United States Patent
Cho et al.

(10) Patent No.: US 12,030,007 B2
(45) Date of Patent: Jul. 9, 2024

(54) APPARATUS FOR TRAPPING REACTION BY-PRODUCT CREATED BY ETCHING PROCESS

(71) Applicant: MILAEBO CO., LTD., Pyeongtaek-si (KR)

(72) Inventors: Che Hoo Cho, Seoul (KR); Yeon Ju Lee, Osan-si (KR); In Hwan Kim, Osan-si (KR); Ji Eun Han, Pyeongtaek-si (KR); Sung Won Yoon, Siheung-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 420 days.

(21) Appl. No.: 17/477,831

(22) Filed: Sep. 17, 2021

(65) Prior Publication Data

US 2022/0410047 A1 Dec. 29, 2022

(30) Foreign Application Priority Data

Jun. 24, 2021 (KR) .................. 10-2021-0082316

(51) Int. Cl.
*B01D 45/08* (2006.01)
*B01D 50/20* (2022.01)
*B01D 53/14* (2006.01)
*H01L 21/67* (2006.01)

(52) U.S. Cl.
CPC ............. *B01D 45/08* (2013.01); *B01D 50/20* (2022.01); *B01D 53/145* (2013.01); *H01L 21/67069* (2013.01)

(58) Field of Classification Search
CPC ...... B01D 45/08; B01D 50/20; B01D 53/145; B01D 46/42; B01D 46/56; H01L 21/67069; H01L 21/67017; C23C 16/4412; H01J 37/32844; H01J 2237/334
See application file for complete search history.

(56) References Cited

U.S. PATENT DOCUMENTS 6,156,107 A * 12/2000 Hayashi ................. B01D 45/08
                                                          438/905
6,238,514 B1 * 5/2001 Gu .................... H01J 37/32844
                                                          118/715
2006/0162862 A1 * 7/2006 Park .................... C23C 16/4412
                                                          118/715
(Continued)

FOREIGN PATENT DOCUMENTS

KR          10-0311145 B1      11/2001
KR          10-0564272 B1       3/2006
(Continued)

*Primary Examiner* — Dung H Bui
(74) *Attorney, Agent, or Firm* — You & IP, LLC

(57) ABSTRACT

The present disclosure relates to an apparatus for trapping a reaction by-product created by an etching process, the apparatus being configured to trap a reaction by-product contained in an unreacted gas discharged after a process is performed in an etching process chamber during a semiconductor manufacturing process, trap and stack the reaction by-product in the form of powder at a position between a vacuum pump and a scrubber through multiple flow path switching structures, multiple trapping structures, and multiple stacking structures, and discharge only a gaseous unreacted gas to the scrubber.

16 Claims, 10 Drawing Sheets

(56) References Cited

U.S. PATENT DOCUMENTS

| | | | |
|---|---|---|---|
| 2007/0107595 A1* | 5/2007 | Na | B01D 53/68 95/288 |
| 2009/0107091 A1* | 4/2009 | Cho | C23C 16/4412 55/440 |
| 2010/0166630 A1* | 7/2010 | Gu | B01F 25/4521 422/171 |
| 2020/0164296 A1* | 5/2020 | Cho | B01D 45/16 |
| 2020/0217559 A1* | 7/2020 | Hwang | F24H 3/00 |
| 2020/0321226 A1* | 10/2020 | Cho | C23C 16/4412 |
| 2021/0039034 A1* | 2/2021 | Cho | B01D 45/08 |
| 2021/0053002 A1* | 2/2021 | Cho | B01D 45/06 |
| 2021/0134621 A1* | 5/2021 | Cho | C23C 16/4412 |
| 2022/0143543 A1* | 5/2022 | Maeng | B01D 45/08 |
| 2022/0228261 A1* | 7/2022 | Cho | C23C 16/4412 |
| 2022/0349052 A1* | 11/2022 | Cho | C23C 16/4411 |
| 2022/0349053 A1* | 11/2022 | Cho | B01D 8/00 |

FOREIGN PATENT DOCUMENTS

| | | |
|---|---|---|
| KR | 10-0631924 B1 | 10/2006 |
| KR | 10-2209205 B1 | 2/2021 |

* cited by examiner

APPARATUS FOR TRAPPING REACTION BY-PRODUCT CREATED BY ETCHING PROCESS

CROSS-REFERENCE TO RELATED APPLICATIONS

This application claims the priority of Korean Patent Application No. 10-2021-0082316 filed on Jun. 24, 2021, in the Korean Intellectual Property Office, the disclosure of which is incorporated herein by reference.

BACKGROUND

Field

The present disclosure relates to an apparatus for trapping a reaction by-product created by an etching process, and more particularly, to a trapping apparatus for trapping a reaction by-product in the form of powder through multiple flow path switching structures, multiple trapping structures, and multiple stacking structures, i.e., a trapping apparatus for trapping, at a front end of a scrubber, a reaction by-product contained in an unreacted gas discharged from the scrubber via a vacuum pump after a process is performed in an etching process chamber during a semiconductor manufacturing process.

DESCRIPTION OF THE RELATED ART

In general, a semiconductor manufacturing process is broadly divided into a front-end process (fabrication process) and a back-end process (assembly process). The front-end process refers to a process of manufacturing semiconductor chips by processing specific patterns by repeatedly performing a procedure of depositing thin films on wafers in various types of process chambers and a procedure of selectively etching the deposited thin films. The back-end process refers to a process of individually separating the chips manufactured in the front-end process and then assembling finished products by combining the chips and lead frames.

In this case, the process of depositing the thin film on the wafer or etching the thin film deposited on the wafer is performed at a high temperature by injecting required process gases such as silane, arsine, boron chloride, hydrogen, nitrogen, and gaseous water, and process gases such as precursor gas required for deposition of the thin film into a process chamber through a gas injection system. In this case, various types of non-deposited reaction by-products, unreacted ignitable gases, and harmful gases containing corrosive foreign substances and toxic substances are produced in large amount in the process chamber.

For this reason, in order to purify and discharge unreacted gases discharged from the process chamber, a semiconductor manufacturing apparatus has a scrubber installed at a rear end of a vacuum pump for creating a vacuum in the process chamber, and the scrubber purifies the unreacted gases discharged from the process chamber and discharges the purified gas into the atmosphere.

However, because the scrubber purifies and processes only gaseous reaction by-products, there is a structural problem in that the reaction by-products coagulate and clog an inlet of the scrubber unless particulate reaction by-products contained in the unreacted gas discharged from the process chamber are trapped in advance.

Accordingly, there is a need to develop an apparatus for trapping a reaction by-product, which is positioned between a vacuum pump and a scrubber and traps a particulate reaction by-product contained in an unreacted gas.

DOCUMENTS OF RELATED ART

Patent Documents (Patent Document 1) Korean Patent No. 10-0311145 (registered on Sep. 24, 2001)
(Patent Document 2) Korean Patent No. 10-0564272 (registered on Mar. 20, 2006)
(Patent Document 3) Korean Patent No. 10-0631924 (registered on Sep. 27, 2006)
(Patent Document 4) Korean Patent No. 10-2209205 (registered on Jan. 25, 2021)

SUMMARY

An object to be achieved by the present disclosure is to provide an apparatus for trapping a reaction by-product created by an etching process, the apparatus being configured to trap a reaction by-product contained in an unreacted gas discharged after a process is performed in an etching process chamber during a semiconductor manufacturing process, trap and stack the reaction by-product in the form of powder at a position between a vacuum pump and a scrubber through multiple flow path switching structures, multiple trapping structures, and multiple stacking structures, and discharge only a gaseous unreacted gas to the scrubber.

An exemplary embodiment of the present disclosure provides an apparatus for trapping a reaction by-product created by an etching process, which traps a reaction by-product contained in an unreacted gas discharged to a scrubber from a vacuum pump during a semiconductor manufacturing process, the apparatus including: an internal trapping tower including: a first trapping structure configured to guide a flow of the unreacted gas, introduced from an upper side, downward to an outer periphery, trap and stack the reaction by-product, and trap the reaction by-product again multiple times at a lower side; a second trapping structure configured to guide the unreacted gas, introduced from the outer periphery, toward a central portion, move the unreacted gas downward, and trap and stack the reaction by-product together with the reaction by-product trapped at the lower side of the first trapping structure; a third trapping structure configured to guide the unreacted gas, introduced to the central portion, toward the outer periphery and trap and stack the reaction by-product multiple times; a fourth trapping structure configured to guide the unreacted gas, introduced from the outer periphery, toward the central portion, move the unreacted gas downward, and trap and stack the reaction by-product; and a fifth trapping structure configured to guide the unreacted gas, introduced to the central portion, downward through the outer periphery, trap and stack the reaction by-product, and trap the reaction by-product again multiple times at the lower side, in which the unreacted gas, introduced into a gas inlet port of the housing, flows toward the outer periphery or the central portion and sequentially flows downward, such that the reaction by-product is trapped and stacked, and then only the unreacted gas is discharged to a gas discharge port.

In the exemplary embodiment, the first trapping structure, the second trapping structure, the third trapping structure, the fourth trapping structure, and the fifth trapping structure may be fastened by spacing members so as to be vertically spaced apart from one another at predetermined intervals, and a support part may be provided on an upper surface of a lower plate of the housing and support the fifth trapping structure spaced apart from the lower plate of the housing at a predetermined interval to support overall loads of the first to fourth trapping structures.

In the exemplary embodiment, the first trapping structure may include: a trapping disc configured to guide the flow of the introduced unreacted gas to the outer periphery and trap the reaction by-product; and a trapping cylinder part installed on a lower surface of the trapping disc and including a plurality of trapping cylinders disposed in multiple stages to serve as a filter for trapping the reaction by-product contained in the introduced unreacted gas multiple times.

In the exemplary embodiment, the plurality of trapping cylinders of the trapping cylinder part may have different diameters and be installed in multiple stages at predetermined intervals, the trapping cylinders may each have a plurality of holes arranged in multiple stages around a peripheral surface thereof, the hole formed in the trapping cylinder positioned at an outermost periphery may have the largest size, and the size of the hole may decrease as the position of the trapping cylinder become closer to the inner side of the trapping cylinder part.

In the exemplary embodiment, the second trapping structure may include: a trapping disc configured to guide the unreacted gas, introduced from the outer periphery, toward the central portion and trap and stack the reaction by-product; a discharge tube installed to vertically penetrate the central portion of the trapping disc and configured to discharge the unreacted gas downward while preventing a leakage of the trapped reaction by-product; and a flow path guide plate installed around a lower end of the discharge tube and configured to block an upward flow of the discharged unreacted gas within a predetermined space region to improve trapping efficiency.

In the exemplary embodiment, the trapping disc may be a circular disc having a diameter corresponding in size to an inner diameter of a housing main body constituting the housing and prevent the unreacted gas from flowing downward directly to the third trapping structure at the lower side.

In the exemplary embodiment, an upper portion of the discharge tube may protrude to be positioned inside the trapping cylinder part of the first trapping structure, a lower portion of the discharge tube may be positioned at an upper end of a trapping plate part of the third trapping structure, and a plurality of holes for introducing the unreacted gas may be arranged in multiple stages around one section of the protruding upper portion of the discharge tube.

In the exemplary embodiment, the third trapping structure may include: a trapping disc configured to guide the flow of the introduced unreacted gas toward the outer periphery, move the unreacted gas downward, and trap and stack the reaction by-product; a trapping plate part including a plurality of trapping plates having a plurality of holes, circularly arranged on an upper surface of the trapping disc, and configured to allow the unreacted gas introduced from the upper side to remain, trap and stack the reaction by-product, and allow the unreacted gas to flow toward the outer periphery; and a blocking wall part configured to circularly surround an outer periphery of the trapping plate part, spaced apart from the trapping plate part at a predetermined interval, and configured to discharge the unreacted gas while preventing a leakage of the trapped reaction by-product.

In the exemplary embodiment, the third trapping structure may further include a flow path guide part having a band shape, vertically protruding downward along a periphery of the trapping disc, and configured to guide the downward flow of the unreacted gas.

In the exemplary embodiment, a height of the trapping plate part may be greater than a height of the blocking wall part.

In the exemplary embodiment, the blocking wall part may include at least two or more blocking walls having no hole, circularly disposed, and spaced apart from one another at a predetermined interval.

In the exemplary embodiment, the fourth trapping structure may include: a trapping disc configured to guide the unreacted gas, introduced from the outer periphery, toward the central portion and trap and stack the reaction by-product; and a discharge tube configured to penetrate upward the central portion of the trapping disc and having an expanded tube portion provided at an upper portion thereof and configured to prevent a leakage of the trapped reaction by-product and discharge the unreacted gas downward.

In the exemplary embodiment, the trapping disc may be a circular disc having a diameter corresponding in size to an inner diameter of a housing main body and prevent the unreacted gas from flowing downward directly to the fifth trapping structure.

In the exemplary embodiment, the expanded tube portion may have an oblique shape gradually inclined outward and upward and have a plurality of holes arranged in multiple stages around the expanded tube portion to guide a discharge and a flow of the unreacted gas.

In the exemplary embodiment, the fifth trapping structure may include: a trapping disc configured to block a downward movement of the unreacted gas introduced to the central portion from the upper side, guide the downward flow of the unreacted gas through the outer periphery, discharge the unreacted gas so that the reaction by-product is trapped and stacked; a gas receiving portion provided in a peripheral direction on a lower surface of the trapping disc and configured to guide a downward flow of the unreacted gas, introduce the unreacted gas into the gas receiving portion, and receive the unreacted gas; and a trapping plate part installed on a lower surface of the trapping disc, disposed inside the gas receiving portion, and including a plurality of trapping plates arranged in a quadrangular shape in multiple stages and having a plurality of holes to prevent a leakage of the introduced unreacted gas, trap the reaction by-product multiple times, and discharge only the unreacted gas to the gas discharge port.

In the exemplary embodiment, a length of the gas receiving portion protruding downward may be shorter than a length of the trapping plate part, and a plurality of fastening parts may be provided outward along a periphery of the gas receiving portion and fastened to a support part protruding upward from a lower plate of the housing.

In the exemplary embodiment, the trapping plates of the trapping plate part may be arranged in a quadrangular shape and spaced apart from one another so that edges of the trapping plates are not attached to one another to allow the unreacted gas to be introduced therebetween, the hole formed in each of the trapping plates arranged in a quadrangular shape and disposed at an outermost periphery may have the largest size, and the size of the hole may decrease as the position of the trapping plates arranged in a quadrangular shape becomes closer to the inner side of the trapping plate part.

According to the apparatus for trapping a reaction by-product created by an etching process according to the present disclosure having the above-mentioned features, the reaction by-product contained in the unreacted gas, which is discharged from the vacuum pump after the process is performed in the etching process chamber during the semiconductor manufacturing process, may be trapped and stacked in the form of powder multiple times at the front end of the scrubber by the structure for switching flow directions and generating multiple vortices, and only the gaseous unreacted gas may be discharged.

According to the present disclosure as described above, the trapping apparatus for removing the reaction by-product contained in the unreacted gas is provided at the front end of the scrubber. Therefore, it is possible to increase the maintenance cycle for the scrubber and continuously use the trapping apparatus for three months or more.

The present disclosure is a useful invention having many advantages as described above and is an invention that is highly expected to be used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
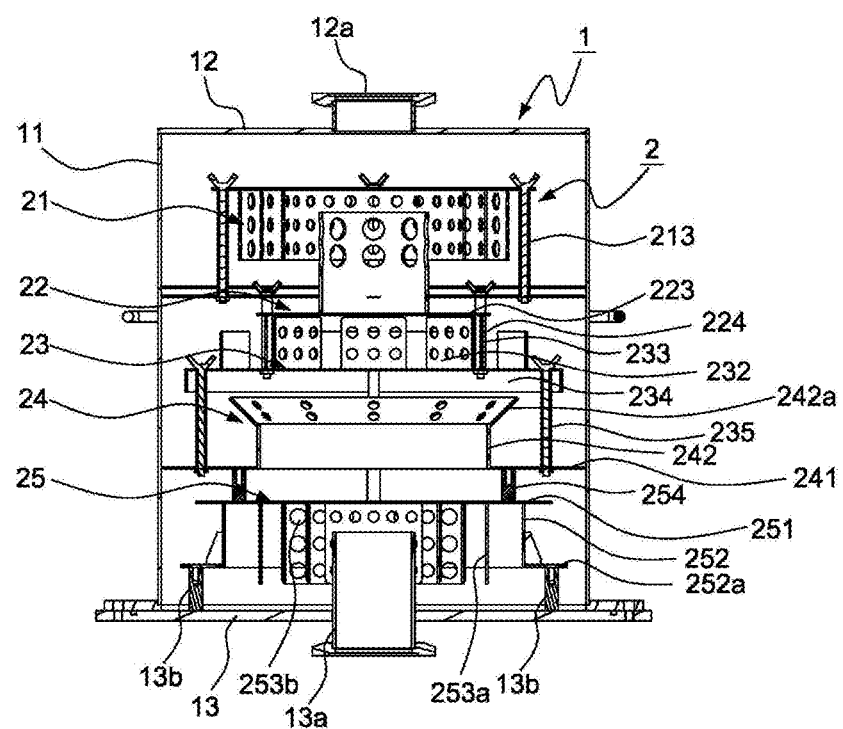
FIG. 1 is a cross-sectional view illustrating a configuration of an apparatus for trapping a reaction by-product according to an embodiment of the present disclosure.
Figure 2:
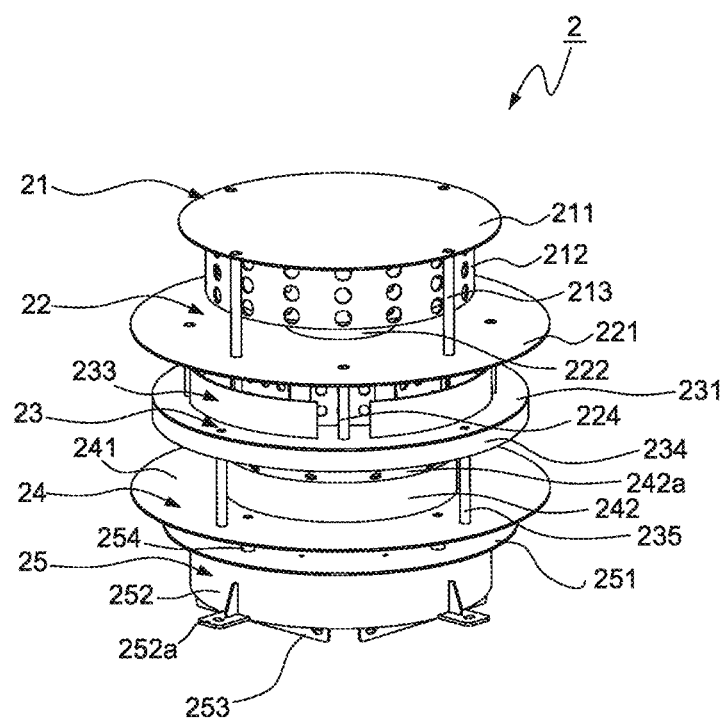
FIG. 2 is a perspective view illustrating an internal trapping tower of the apparatus for trapping a reaction by-product according to the embodiment of the present disclosure.
Figure 3:
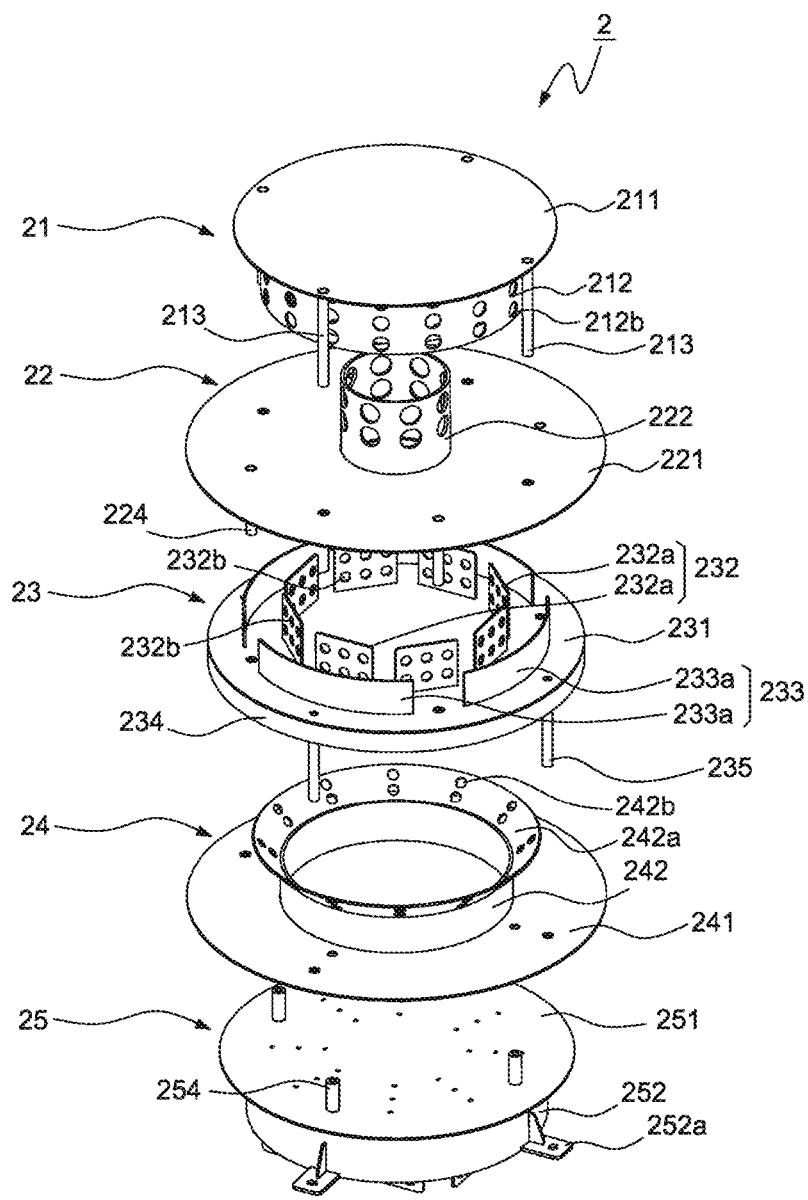
FIG. 3 is an exploded perspective view illustrating the internal trapping tower according to the embodiment of the present disclosure.
Figure 4:
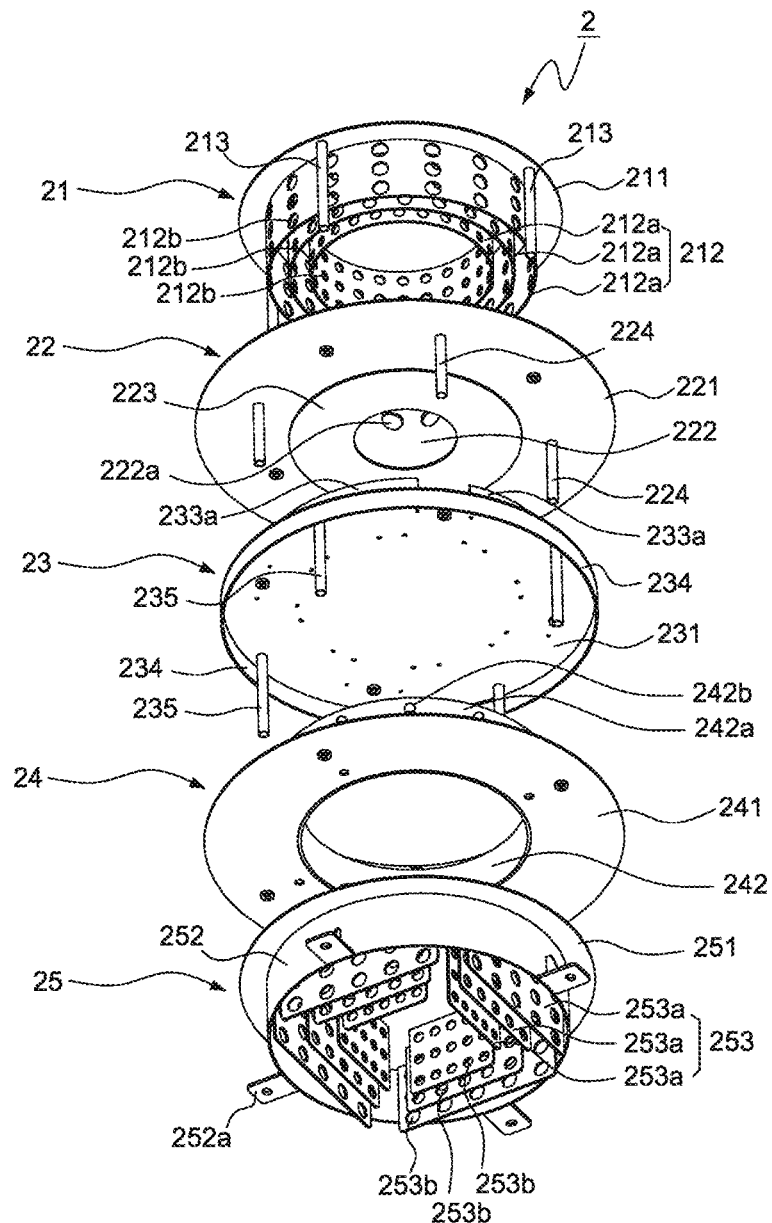
FIG. 4 is an exploded perspective view illustrating a lower side of the internal trapping tower according to the embodiment of the present disclosure.

FIG. 1 is a cross-sectional view illustrating a configuration of an apparatus for trapping a reaction by-product according to an embodiment of the present disclosure, FIG. 2 is a perspective view illustrating an internal trapping tower of the apparatus for trapping a reaction by-product according to the embodiment of the present disclosure, FIG. 3 is an exploded perspective view illustrating the internal trapping tower according to the embodiment of the present disclosure, and FIG. 4 is an exploded perspective view illustrating a lower side of the internal trapping tower according to the embodiment of the present disclosure.

As illustrated, a trapping apparatus according to the present disclosure is positioned between a vacuum pump and a scrubber, traps a reaction by-product contained in an unreacted gas discharged from a vacuum pump after an etching process is performed in a process chamber (not illustrated) during a semiconductor process. The trapping apparatus traps and stacks the reaction by-product in the form of powder through multiple flow path switching structures, multiple trapping structures, and multiple stacking structures, and discharges only the remaining gaseous unreacted gas to a scrubber.

To this end, the trapping apparatus includes: a housing 1 configured to accommodate an unreacted gas introduced from an upper gas inlet port and discharge the unreacted gas to a lower gas discharge port; and an internal trapping tower 2 configured to sequentially switch flow paths toward an outer peripheral portion or a central portion to prevent the unreacted gas introduced into the housing from directly flowing downward to the lower gas discharge port and leaking through the lower gas discharge port, the internal trapping tower 2 being configured to move the unreacted gas downward, trap and stack the reaction by-product, and discharge only the remaining unreacted gas. To this end, the internal trapping tower 2 includes a plurality of trapping structures disposed in multiple stages and vertically spaced apart from one another at a predetermined interval.

The housing 1 is configured vertically to introduce the gas discharged from the vacuum pump to the scrubber into an upper portion of the housing 1, accommodate the gas, and discharge the gas. The housing 1 includes a housing main body configured to accommodate the introduced gas; an upper plate 12 having a gas inlet port 12a protruding upward; and a lower plate 13 having a gas discharge port 13a protruding in two opposite directions, i.e., upward and downward.

According to the embodiment of the present disclosure, the housing including the housing main body 11, the upper plate 12, and the lower plate 13 is illustrated as having a cylindrical shape elongated in the vertical direction, but the present disclosure is not limited thereto. The housing may of course have a necessary shape such as a quadrangular column shape or a polygonal column shape. However, for the convenience of description, the present disclosure will be described below with reference to the configuration in which the housing has a cylindrical shape.

The housing main body 11 has a hollow housing shape and serves to store the introduced gas so that the reaction by-product, which is contained in the unreacted gas introduced into a first trapping structure 21, a second trapping structure 22, a third trapping structure 23, a fourth trapping structure 24, and a fifth trapping structure 25 installed in multiple stages in the vertical direction inside the housing main body 11, is aggregated and trapped in the form of powder.

The upper plate 12 serves as a cover for covering an opened upper side of the housing main body 11 and serves to introduce the gas through the gas inlet port 12a protruding upward.

The lower plate 13 serves as a cover for covering an opened lower side of the housing main body 11 and serves to discharge the unreacted gas, from which the reaction by-product is completely removed, to the scrubber through the gas discharge port 13a protruding in the two opposite directions, i.e., upward and downward.

In addition, support parts 13b are provided on an upper surface of the lower plate 13, fix the internal trapping tower 2, and support loads of the internal trapping tower 2. That is, the fifth trapping structure 25 positioned on an upper portion of the lower plate is fixed and supported to be spaced apart from an upper surface of the upper plate at a predetermined interval, such that the fifth trapping structure 25 supports overall loads of the first to fourth trapping structures 21, 22, 23, and 24 which are connected in multiple stages above the fifth trapping structure 25.

In addition, the lower plate 13 has a non-illustrated support frame having any shape, a predetermined height, and a predetermined length, and mobile wheels installed on a lower portion of the support frame, such that the trapping apparatus may move when the trapping apparatus is required to move.

Of course, the lower plate 13 may be fixed to a floor or a fixing frame in a factory, such that the lower plate 13 may be configured as a stationary lower plate.

The internal trapping tower 2 includes the five trapping structures disposed vertically from the upper end to the lower end and is configured to trap and stack the reaction by-product multiple times. The configuration of the internal trapping tower 2 will be described below.

The first trapping structure 21 is positioned at the uppermost end. The first trapping structure 21 guides a flow of the unreacted gas, introduced from above, downward through an outer periphery thereof, traps and stacks the reaction by-product, and traps the reaction by-product again multiple times at the lower side.

The second trapping structure 22 is positioned at a lower end of the first trapping structure 21. The second trapping structure 22 guides the unreacted gas, introduced from the outer periphery, toward a central portion, moves the unreacted gas downward, traps the reaction by-product, and stacks the trapped and falling reaction by-product at the lower side of the first trapping structure.

The third trapping structure 23 is positioned at a lower end of the second trapping structure 22. The third trapping structure 23 guides the unreacted gas, introduced to the central portion, toward the outer periphery, and traps and stacks the reaction by-product multiple times.

The fourth trapping structure 24 is positioned at a lower end of the third trapping structure 23. The fourth trapping structure 24 guides the unreacted gas, introduced from the outer periphery, toward the central portion, moves the unreacted gas downward, and traps and stacks the reaction by-product.

The fifth trapping structure 25 is positioned at a lower end of the fourth trapping structure 24. The fifth trapping structure 25 guides the unreacted gas, introduced to the central portion, downward through the outer periphery, traps and stacks the reaction by-product, traps the reaction by-product again multiple times at the lower side, stacks the reaction by-product on the upper surface of the lower plate, and then discharges only the unreacted gas through the gas discharge port of the housing.

The first to fifth trapping structures 21, 22, 23, 24, and 25 are connected and fixed, using spacing members, with a predetermined spacing distance corresponding to a necessary height in accordance with the trapping structures positioned adjacent to one another vertically. With the use of the spacing members, the trapping structures positioned vertically are fixed to be spaced apart from one another without being attached directly to one another. Therefore, it is possible to smoothly move the unreacted gas and trap and stack the reaction by-product while ensuring a space for switching the flow paths of the unreacted gas.

Regarding a fastening method using the spacing members, the spacing members each having a necessary length are prepared between the trapping structures disposed vertically, fastening rods or bolts having screw threads are inserted into the hollow spacing members, and then the fastening rods or bolts are fastened by nuts. Of course, the above-mentioned fastening method is merely an example, and a method selected from various well-known fastening methods including fitting and welding may of course be applied.

As an embodiment, a process in which the trapping apparatus traps the particulate reaction by-product contained in the unreacted gas discharged after the etching process in the process chamber will be described below.

During the etching process using $BCl_3$ and $N_2$ in the process chamber, non-volatile residues are created when $BCl_3$ comes into contact with oxygen (O) or water ($H_2O$) because $BCl_3$ has high reactivity and high ability to acquire oxygen. For example, a reaction such as, $2BCl_3+O\rightarrow B_2O_3+6Cl$, occurs.

In addition, when an etching precursor is used for a process of etching an $Al_2O_3$ thin film, $B_2O_3$ (non-volatile) and $AlCl_3$ (volatile) are created.

Therefore, according to the trapping apparatus according to the present disclosure, the reaction by-product contained in the unreacted gas, which may be introduced into the scrubber from the vacuum pump after the etching process is performed, may be trapped and stacked multiple times which passing through the trapping structures disposed in multiple stages, and then only the remaining gaseous unreacted gas is supplied to the scrubber. Therefore, it is possible to remove the reaction by-product while preventing the inlet of the scrubber from being clogged.

The respective trapping structures, which constitute the internal trapping tower 2, will be described below in detail.

Figure 5:
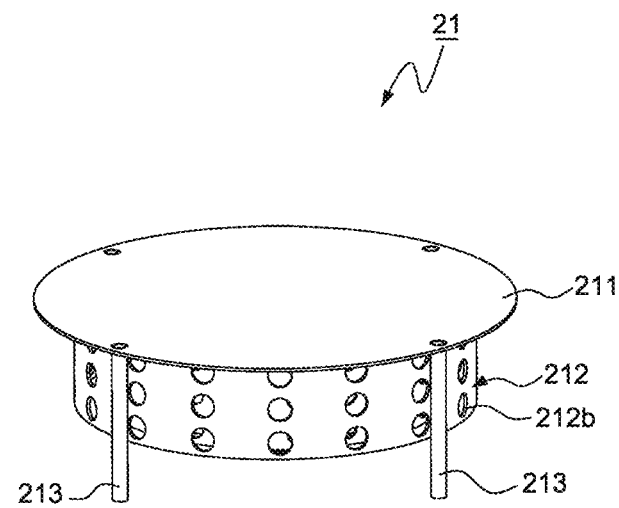
FIG. 5 is an exemplified view illustrating a configuration of a first trapping structure according to the embodiment of the present disclosure.

FIG. 5 is an exemplified view illustrating a configuration of the first trapping structure according to the embodiment of the present disclosure.

Referring to FIGS. 1 to 4 and 5, the first trapping structure 21 includes: a trapping disc 211 configured to guide a flow of the unreacted gas, which is introduced through the gas inlet port 12a of the upper plate 12 of the housing main body 11, to the outer periphery and trap the reaction by-product; and a trapping cylinder part 212 installed on a lower surface of the trapping disc 211 and including a plurality of trapping cylinders 212a disposed in multiple stages to serve as a filter for trapping the reaction by-product contained in the introduced unreacted gas multiple times.

The trapping disc 211 is a circular disc having a diameter smaller than an inner diameter of the housing main body. When the unreacted gas, which is introduced from the gas inlet port 12a positioned at the central portion of the upper plate 12 of the housing main body 11, collides with a surface of the trapping disc 211, the unreacted gas is uniformly guided and spread in a direction from the central portion to the outer periphery and flows downward from an end of the trapping disc 211. In this case, the reaction by-product contained in the introduced unreacted gas is aggregated, trapped, and stacked in the form of powder on an upper surface of the trapping disc.

The trapping cylinder part 212 is fastened to the lower surface of the trapping disc 211. The trapping cylinder part includes the plurality of trapping cylinders 212a having different diameters and installed in multiple stages at a predetermined interval. As an embodiment, three trapping cylinders are disposed in multiple stages, but the present disclosure is not limited to the number of trapping cylinders. At least two or more trapping cylinders may be disposed in multiple stages to trap the reaction by-product multiple times.

The respective trapping cylinders 212a, which constitute the trapping cylinder part 212, each have a plurality of holes 212b arranged in multiple stages along a circumferential surface of each of the trapping cylinders 212a. The hole 212b formed in the trapping cylinder 212a positioned at the outermost periphery has the largest diameter, and the trapping cylinder 212a disposed at the inner side of the trapping cylinder part 212 has the hole 212b having a smaller diameter. As described above, since the size of the hole decreases as the position of the trapping cylinder becomes closer to the inner side of the trapping cylinder part 212, the unreacted gas, which has passed through the holes of the trapping cylinder positioned at the outer side, needs to pass through the relatively smaller holes of the trapping cylinder positioned at the inner side. Therefore, as the unreacted gas collides with the surfaces of the trapping cylinders and passes through the small holes, differences in flow velocities and vortices are generated, such that the flow of the unreacted gas is retarded, which improves trapping efficiency on the surfaces of the respective trapping cylinders.

In addition, a plurality of spacing members 213 is installed on the lower surface of the trapping disc 211 and maintains a state in which the first trapping structure 21 is spaced apart upward from the second trapping structure 22. The spacing member may have a length which defines a height that prevents the lower surface of the trapping disc from clogging an upper end of a discharge tube of the second trapping structure 22 even though the discharge tube of the second trapping structure 22 protrudes from the central portion inside the trapping cylinder disposed at the innermost side of the trapping cylinder part 212. Since the spacing members having heights are installed vertically as described above, the unreacted gas, which has been subjected to the trapping process while sequentially passing through the trapping cylinders, may flow into an upper portion of the discharge tube and holes formed around the upper portion of the discharge tube and flow downward.

Figure 6:
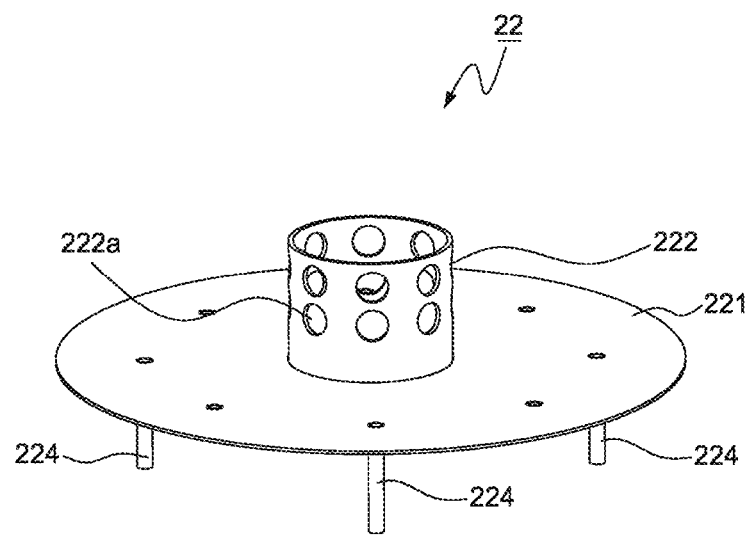
FIG. 6 is an exemplified view illustrating a configuration of a second trapping structure according to the embodiment of the present disclosure.

FIG. 6 is an exemplified view illustrating a configuration of the second trapping structure according to the embodiment of the present disclosure.

Referring to FIGS. 1 to 4 and 6, the second trapping structure 22 includes: a trapping disc 221 configured to guide the unreacted gas, introduced from the outer periphery, toward the central portion and trap and stack the reaction by-product; the discharge tube 222 installed to vertically penetrate the central portion of the trapping disc and configured to discharge the unreacted gas downward while preventing a leakage of the trapped reaction by-product; and a flow path guide plate 223 installed around a lower end of the discharge tube and configured to block an upward flow of the discharged unreacted gas within a predetermined space region to improve the trapping efficiency.

The trapping disc 221 is a circular disc having a diameter corresponding in magnitude to the inner diameter of the housing main body. The trapping disc 221 prevents the unreacted gas, which is introduced downward through the outer periphery of the trapping disc 211 of the first trapping structure 21, from flowing downward directly toward the third trapping structure 23. The trapping disc 221 guides the unreacted gas so that the unreacted gas flows to the discharge tube 222 positioned at the central portion of the trapping disc 221. In this case, the reaction by-product contained in the introduced unreacted gas is aggregated, trapped, and stacked in the form of powder on the upper surface of the trapping disc.

In addition, the reaction by-product, which is trapped multiple times by the trapping cylinder part 212 of the first trapping structure 21 positioned above the trapping disc 221, falls onto and is also stacked on the trapping disc 221.

The discharge tube 222 vertically penetrates the central portion of the trapping disc 221 and protrudes upward and downward. An upper portion of the discharge tube 222 protrudes to be positioned at the inner side of the trapping cylinder part 212 of the first trapping structure 21, and a lower portion of the discharge tube 222 is positioned at an upper end of a trapping plate part of the third trapping structure 23.

In addition, the plurality of holes 222a is arranged in multiple stages around one section of the upper portion of the discharge tube 222 that protrudes upward. The unreacted gas is introduced into the discharge tube 222 in a transverse direction and discharged downward. With this configuration, the unreacted gas, which has passed through the trapping cylinder part 212 of the first trapping structure 21, is introduced into the discharge tube through the upper opening and the lateral holes, such that the unreacted gas is smoothly discharged. In this case, the hole 222a has a larger size than the hole 212b formed around the trapping cylinder 212a positioned at the innermost side among the trapping cylinders 212a that constitute the trapping cylinder part 212 of the first trapping structure 21. Therefore, vortices are further generated due to differences in flow velocities between the unreacted gas directly colliding with the discharge tube 222 and the unreacted gas directly passing through the holes, thereby improving the trapping efficiency.

The flow path guide plate 223 is a circular plate having a doughnut shape and installed around a lower end of the discharge tube. The flow path guide plate 223 allows the unreacted gas to remain in a lower space in a region of the trapping plate part of the third trapping structure 23 by preventing the unreacted gas from flowing upward from the trapping disc 221 again immediately after the unreacted gas is discharged through the lower end of the discharge tube. That is, a position at which the lower end of the discharge tube is positioned corresponds to an upper portion of the trapping plate part 232 of the third trapping structure 23. Unless the flow of the unreacted gas is controlled, the unreacted gas flows upward toward an upper space immediately after the unreacted gas is discharged from the discharge tube, which causes a deterioration in trapping efficiency in the trapping plate part 232.

For this reason, a diameter of the flow path guide plate corresponds to a diameter of an upper region of the trapping plate part of the third trapping structure 23 on which a plurality of trapping plates is circularly arranged. The flow path guide plate may be disposed adjacent to or in contact with the trapping plate part of the third trapping structure 23 and serves as a cover.

In addition, a plurality of spacing members 224 is installed on the lower surface of the trapping disc 221 and maintains a state in which the second trapping structure 22 is spaced apart upward from the third trapping structure 23. The spacing member may have a length which defines a height that allows the flow path guide plate 223, which is provided at the lower end of the discharge tube protruding downward from the central portion of the second trapping structure 22, to be positioned at the upper end of the trapping plate part 232 of the third trapping structure 23.

Figure 7:
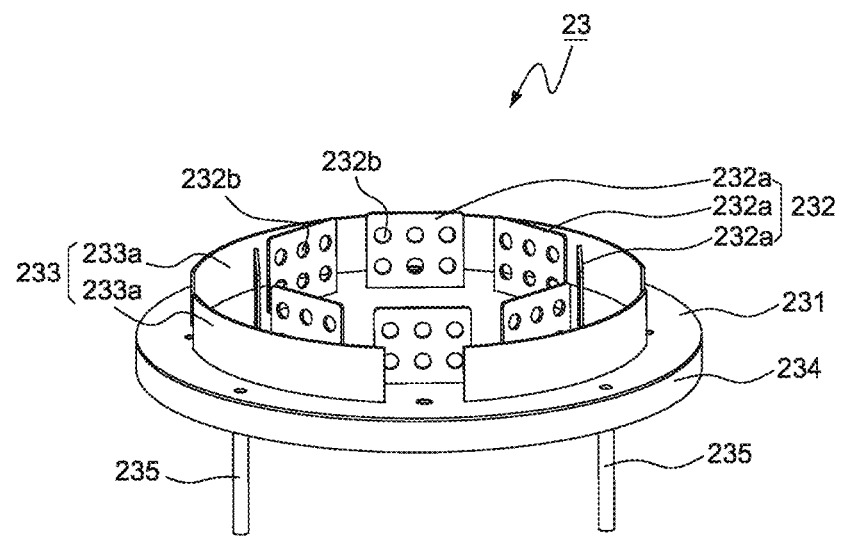
FIG. 7 is an exemplified view illustrating a configuration of a third trapping structure according to the embodiment of the present disclosure.

FIG. 7 is an exemplified view illustrating a configuration of the third trapping structure according to the embodiment of the present disclosure.

Referring to FIGS. 1 to 4 and 7, the third trapping structure 23 includes: a trapping disc 231 configured to guide the flow of the unreacted gas, introduced to the central portion from the upper side, toward the outer periphery, move the unreacted gas downward, and trap and stack the reaction by-product; the trapping plate part 232 including a plurality of trapping plates 232a having a plurality of holes 232b, circularly arranged on an upper surface of the trapping disc, and configured to allow the unreacted gas introduced from the upper side to remain, trap and stack the reaction by-product, and allow the unreacted gas to flow toward the outer periphery; and a blocking wall part 233 configured to circularly surround an outer periphery of the trapping plate part, spaced apart from the trapping plate part at a predetermined interval, and configured to discharge the unreacted gas while preventing a leakage of the trapped reaction by-product.

In addition, the third trapping structure 23 may further include a flow path guide part 234 having a band shape, vertically protruding downward along a periphery of the trapping disc 231, and configured to guide the downward flow of the unreacted gas. The flow path guide part 234 prevents the unreacted gas, which flows downward through the outer periphery of the trapping disc, from flowing directly toward a center of a lower surface of the trapping disc. The flow path guide part 234 guides the unreacted gas to allow the unreacted gas to flow downward to the extent of a height of the flow path guide part and supplies the unreacted gas to the fourth trapping structure 24, thereby improving the efficiency in trapping the reaction by-product.

The trapping disc 231 is a circular disc having a diameter smaller than the inner diameter of the housing main body. When the unreacted gas, which is introduced from the discharge tube 222 of the second trapping structure 22, collides with a surface of the trapping disc 231, the unreacted gas is uniformly guided and spread in a direction from the central portion to the outer periphery and flows downward from an end of the trapping disc 231. In this case, the reaction by-product contained in the introduced unreacted gas is aggregated, trapped, and stacked in the form of powder on the upper surface of the trapping disc.

The trapping plate part 232 and the blocking wall part 233 are configured to have a level difference in the outward direction such that a vertical height of the trapping plate part 232 is greater than a vertical height of the blocking wall part 233. With this configuration, the unreacted gas, which is discharged to the outside through the holes 232b formed in the plurality of trapping plates 232a constituting the trapping plate part 232, may flow to the outer periphery by flowing over the upper end of the blocking wall part 233.

Of course, the unreacted gas flows toward the outer periphery through spaces between the plurality of trapping plates 232a arranged circularly.

The blocking wall part 233 includes at least two or more blocking walls 223a having no hole, circularly disposed, and spaced apart from one another at a predetermined interval.

The unreacted gas flows through the blocking wall part to the outer periphery only through spacing gaps between the blocking walls 223a. Therefore, the flow of the unreacted gas flow is retarded. However, since the height of the trapping plate part 232 is greater than the height of the blocking wall part 233 as described above, the unreacted gas may flow to the outside through various flow paths.

In addition, a plurality of spacing members 235 is installed on the lower surface of the trapping disc 231 and maintains a state in which the third trapping structure 23 is spaced apart upward from the fourth trapping structure 24. The spacing member may have a length which defines a height that allows a lower end of the flow path guide part 234 protruding downward from the peripheral end of the trapping disc 231 of the third trapping structure 23 to coincide in height with an upper end of an enlarged head type discharge tube 242 of the fourth trapping structure 24.

Figure 8:
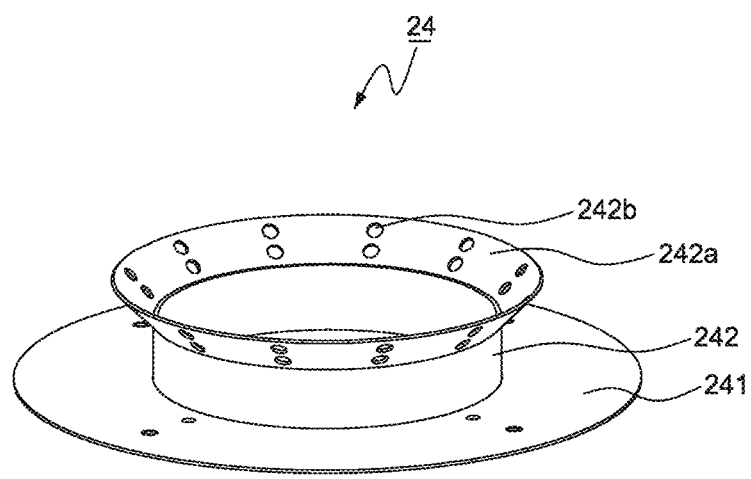
FIG. 8 is an exemplified view illustrating a configuration of a fourth trapping structure according to the embodiment of the present disclosure.

FIG. 8 is an exemplified view illustrating a configuration of the fourth trapping structure according to the embodiment of the present disclosure.

Referring to FIGS. 1 to 4 and 8, the fourth trapping structure 24 includes: a trapping disc 241 configured to guide the unreacted gas, introduced from the outer periphery, toward the central portion and trap and stack the reaction by-product; and the discharge tube 242 configured to penetrate upward the central portion of the trapping disc 241 and having an expanded tube portion 242a provided at an upper portion thereof and configured to prevent a leakage of the trapped reaction by-product and discharge the unreacted gas downward.

The trapping disc 241 is a circular disc having a diameter corresponding in magnitude to the inner diameter of the housing main body. The trapping disc 241 prevents the unreacted gas, which is introduced downward through the outer periphery of the trapping disc 231 of the third trapping structure 23, from flowing downward directly toward the fifth trapping structure 25. The trapping disc 241 guides the unreacted gas so that the unreacted gas flows to the discharge tube 242 positioned at the central portion of the trapping disc 241. In this case, the reaction by-product contained in the introduced unreacted gas is aggregated, trapped, and stacked in the form of powder on the upper surface of the trapping disc.

The discharge tube 242 penetrates the central portion of the trapping disc 241 and protrudes upward. The expanded tube portion 242a has an oblique shape gradually inclined outward and upward is provided on the upper portion of the discharge tube 242. Therefore, the unreacted gas, which flows downward from the upper side, collides with the upper surface of the trapping disc 241, and then flows upward, is returned by being curved again at a predetermined angle in an oblique direction of the expanded tube portion. Therefore, the flow of the unreacted gas is retarded in a space portion defined by an area of the trapping disc 241 and a height of the discharge tube 242, thereby improving the trapping efficiency.

In this case, the discharge efficiency deteriorates unless the expanded tube portion 242a provided at the upper end of the discharge tube 242 generates a discharge flow of the unreacted gas. Therefore, a plurality of holes 242b is arranged in multiple stages around the expanded tube portion 242a to guide the discharge and flow of the unreacted gas, such that a part of the unreacted gas is discharged. Further, the holes formed in the expanded tube portion also serve to create vortices by generating differences in flow velocities of the unreacted gas, thereby further improving the efficiency in trapping the reaction by-product.

An inner diameter of the discharge tube 242 may be larger than an inner diameter of the discharge tube 222 of the second trapping structure 24 so that the unreacted gas is smoothly discharged. However, the present disclosure is not limited to the relative size of the inner diameter.

Therefore, a part of the unreacted gas, which flows vertically downward toward the fourth trapping structure 24 from the flow path guide part 234 at the peripheral end of the trapping disc 231 of the third trapping structure 23, flows between an installation space of the flow path guide part 234 and an installation space of the discharge tube 242 from the upper region and then flows downward through the upper end of the discharge tube. Alternatively, a part of the unreacted gas collides with the trapping disc 241 within the lower region, flows upward so that the reaction by-product is trapped and stacked, flows into the discharge tube through the plurality of holes 242b formed in the expanded tube portion 242a of the discharge tube 242, and then flows downward.

Figure 9:
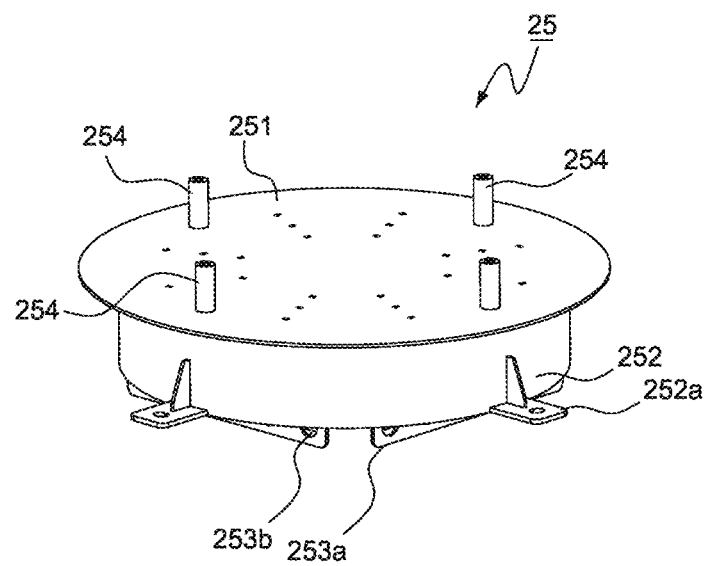
FIG. 9 is an exemplified view illustrating a configuration of a fifth trapping structure according to the embodiment of the present disclosure.

FIG. 9 is an exemplified view illustrating a configuration of the fifth trapping structure according to the embodiment of the present disclosure.

Referring to FIGS. 1 to 4 and 9, the fifth trapping structure 25 includes: a trapping disc 251 configured to block a downward movement of the unreacted gas introduced to the central portion from the upper side, guide the downward flow of the unreacted gas through the outer periphery, discharge the unreacted gas so that the reaction by-product is trapped and stacked; a gas receiving portion 252 provided in a peripheral direction on a lower surface of the trapping disc 251 and configured to guide a downward flow of the unreacted gas, introduce the unreacted gas into the gas receiving portion 252, and receive the unreacted gas; and a trapping plate part 253 installed on a lower surface of the trapping disc 251, disposed inside the gas receiving portion 252, and including a plurality of trapping plates 253a arranged in a quadrangular shape in multiple stages and having a plurality of holes 253b to prevent a leakage of the introduced unreacted gas, trap the reaction by-product multiple times, and discharge only the unreacted gas to the gas discharge port 13a.

The trapping disc 251 is a circular disc having a diameter smaller than the inner diameter of the housing main body. When the unreacted gas, which is introduced from the discharge tube 242 of the fourth trapping structure 24, collides with a surface of the trapping disc 251, the unreacted gas is uniformly guided and spread in a direction from the central portion to the outer periphery and flows downward from an end of the trapping disc 251. In this case, the reaction by-product contained in the introduced unreacted gas is aggregated, trapped, and stacked in the form of powder on the upper surface of the trapping disc.

The gas receiving portion 252 is provided in the peripheral direction at a point within a predetermined distance from a lower outer periphery of the trapping disc 251 and configured to smoothly guide the unreacted gas without delaying the flow of the unreacted gas. As an embodiment, the gas receiving portion 252 is illustrated as having a cylindrical structure, but gas receiving portion 252 may have a structure having a polygonal column shape.

In addition, a length of the gas receiving portion 252 protruding downward is relatively shorter than a length of the trapping plate part 253, thereby smoothly introducing the unreacted gas.

In addition, a plurality of fastening parts 252a is provided outward along a periphery of a lower end of the gas receiving portion 252 and fastened to the support parts 13b protruding upward from the lower plate 13 of the housing 1. As the plurality of fastening parts 252a is fastened to the support parts 13b as described above, the entire fifth trapping structure 25 is kept spaced apart upward from the lower plate of the housing at a predetermined height.

The support parts 13b support the overall load of the internal trapping tower 2 and allow the unreacted gas to be smoothly introduced through the lower side of the fifth trapping structure 25. The lower plate 13 serves to stack the reaction by-product when the reaction by-product, which is trapped multiple times by the trapping plate part 253 positioned above the lower plate 13, is dropped.

In the trapping plate part 253, a size in a width direction of each of the trapping plate 253a arranged in a quadrangular shape at the outermost side is largest, and a size in the width direction of each of the trapping plates 253a positioned at the innermost side is smallest. With this configuration, the trapping plates 253a may be disposed in multiple stages and arranged in a quadrangular shape at a predetermined interval from outside to inside. In this case, the trapping plates 253a may have the same height.

In addition, when the trapping plates 253a are arranged in a quadrangular shape, the trapping plates 253a may be slightly spaced apart from one another so that edges of the trapping plates 253a are not in contact with one another to allow the unreacted gas to be introduced therebetween. In comparison with the case in which the edges are connected to one another, the discharge flow is smooth toward the gas discharge port 13a protruding between gaps between the trapping plates 253a arranged in a quadrangular shape at a central portion of the lower plate, i.e., at the innermost side of the trapping plate part 253. The gaps create vortices by generating differences in flow velocities of the unreacted gas, thereby improving the efficiency in trapping the reaction by-product.

In addition, among the holes 253b formed in the trapping plates 253a, the hole 253b formed in each of the plurality of trapping plates 253a arranged in a quadrangular shape and positioned at the outermost periphery has the largest size, and the size of the hole 253b of each of the plurality of trapping plates 253a arranged in a quadrangular shape decreases as the position of the trapping plate 253a becomes closer to the inner side.

As described above, since the size of the hole decreases as the position of the trapping plate 253a becomes closer to the inner side, the unreacted gas, which has passed through the holes 253b of the trapping plates 253a positioned at the outer side, needs to pass through the relatively small holes of the trapping plates 253b positioned at the inner side. Therefore, as the unreacted gas collides with the surfaces of the trapping plates 253b and passes through the small holes, differences in flow velocities and vortices are generated, such that the flow of the unreacted gas is retarded, which improves the trapping efficiency on the surfaces of the respective trapping cylinders.

In addition, a plurality of spacing members 254 is installed on the upper surface of the trapping disc 251 and maintains a state in which the fourth trapping structure 24 is spaced apart upward from the fifth trapping structure 25. The spacing member may have a length which defines a height that maintains a state in which the lower surface of the trapping disc 241 of the fourth trapping structure 24 is spaced apart from the upper surface of the trapping disc 251 of the fifth trapping structure 25.

According to the apparatus for trapping a reaction by-product according to the present disclosure configured as described above, the unreacted gas, which is discharged from the vacuum pump after the etching process is performed in the process chamber, is introduced through the gas inlet port 12a of the housing 1 installed vertically. Thereafter, the unreacted gas cannot flow downward directly toward the gas discharge port 13a but passes through the internal trapping tower 2 including the first trapping structure 21, the second trapping structure 22, the third trapping structure 23, the fourth trapping structure 24, and the fifth trapping structure 25 arranged vertically in multiple stages. The flow velocity of the unreacted gas is decreased by the multiple flow path switching structures, the multiple trapping structures, and the multiple stacking structures and the vortices are generated. Therefore, the reaction by-product contained in the introduced unreacted gas is aggregated and trapped in the form of powder, and only the gaseous unreacted gas is discharged through the gas discharge port and supplied to the scrubber.

Figure 10:
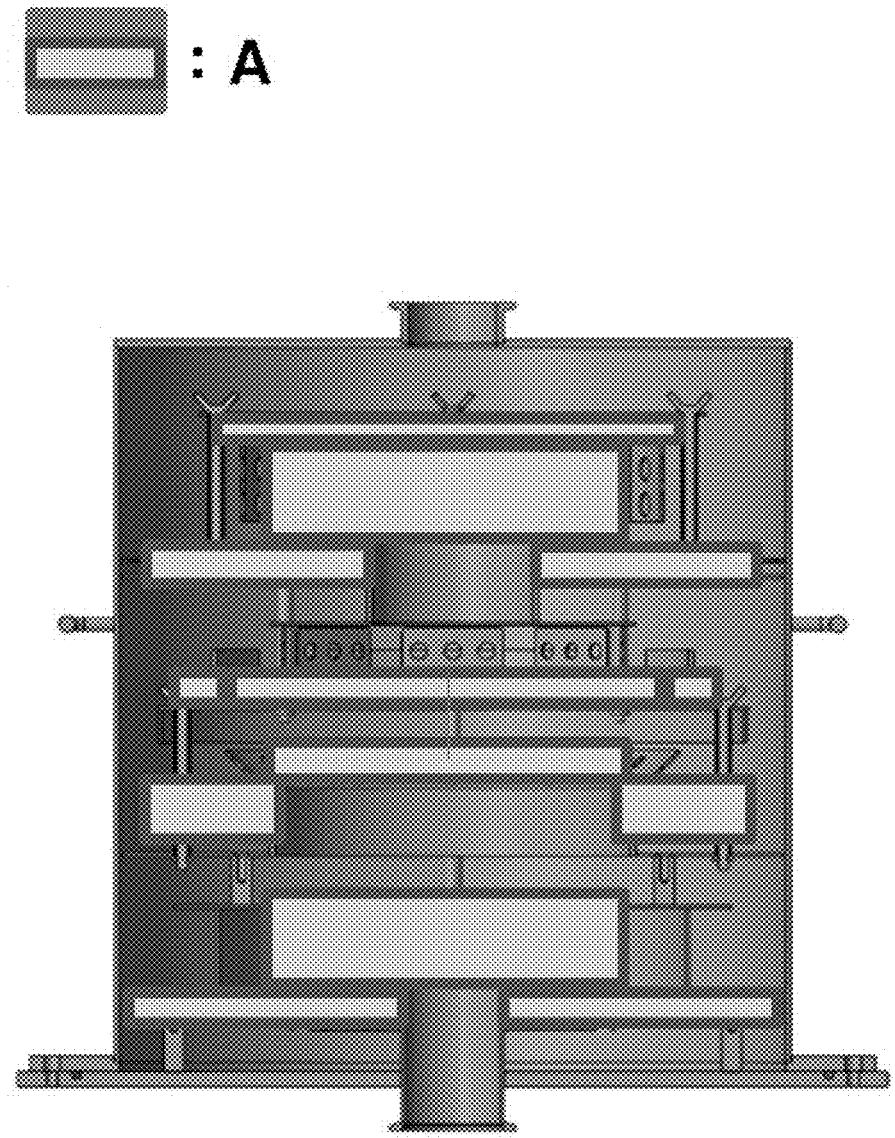
FIG. 10 is an exemplified view illustrating a trapping tendency in the apparatus for trapping a reaction by-product according to the embodiment of the present disclosure.
Figure 11:
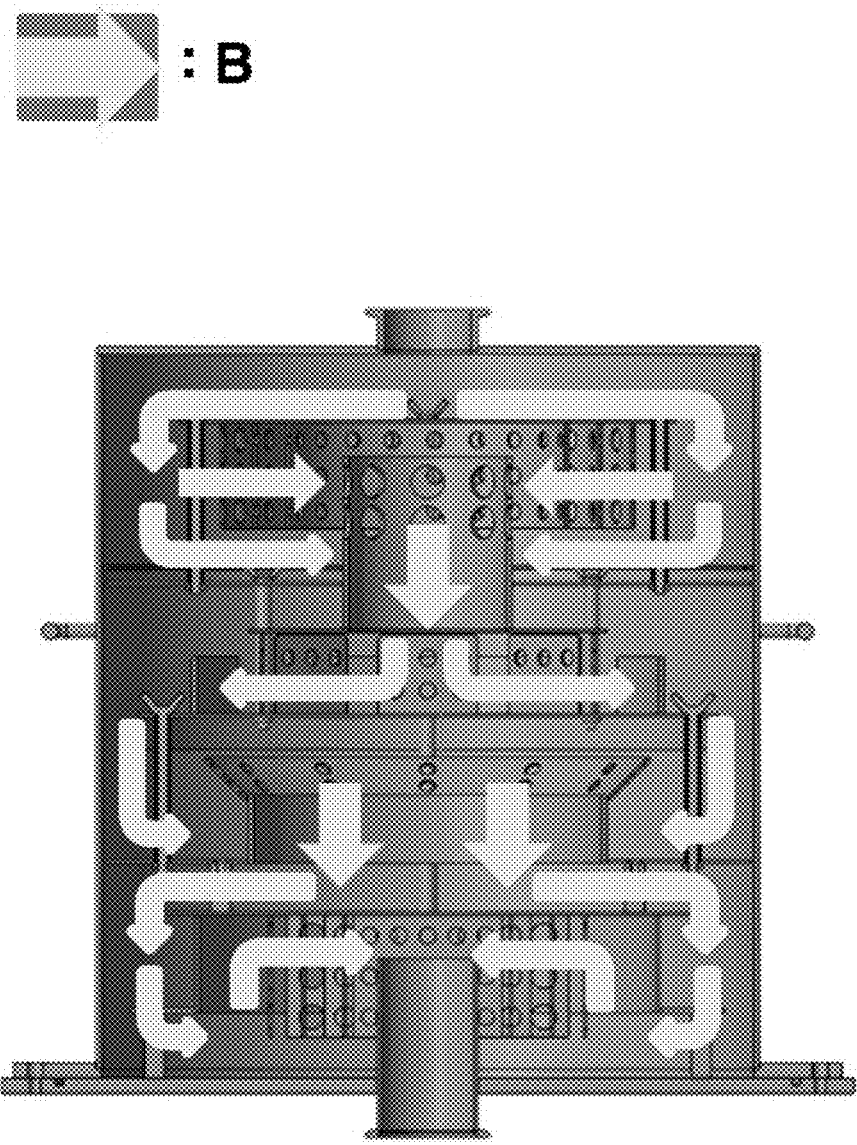
FIG. 11 is an exemplified view illustrating a gas flow in the apparatus for trapping a reaction by-product according to the embodiment of the present disclosure.
Figure 12:
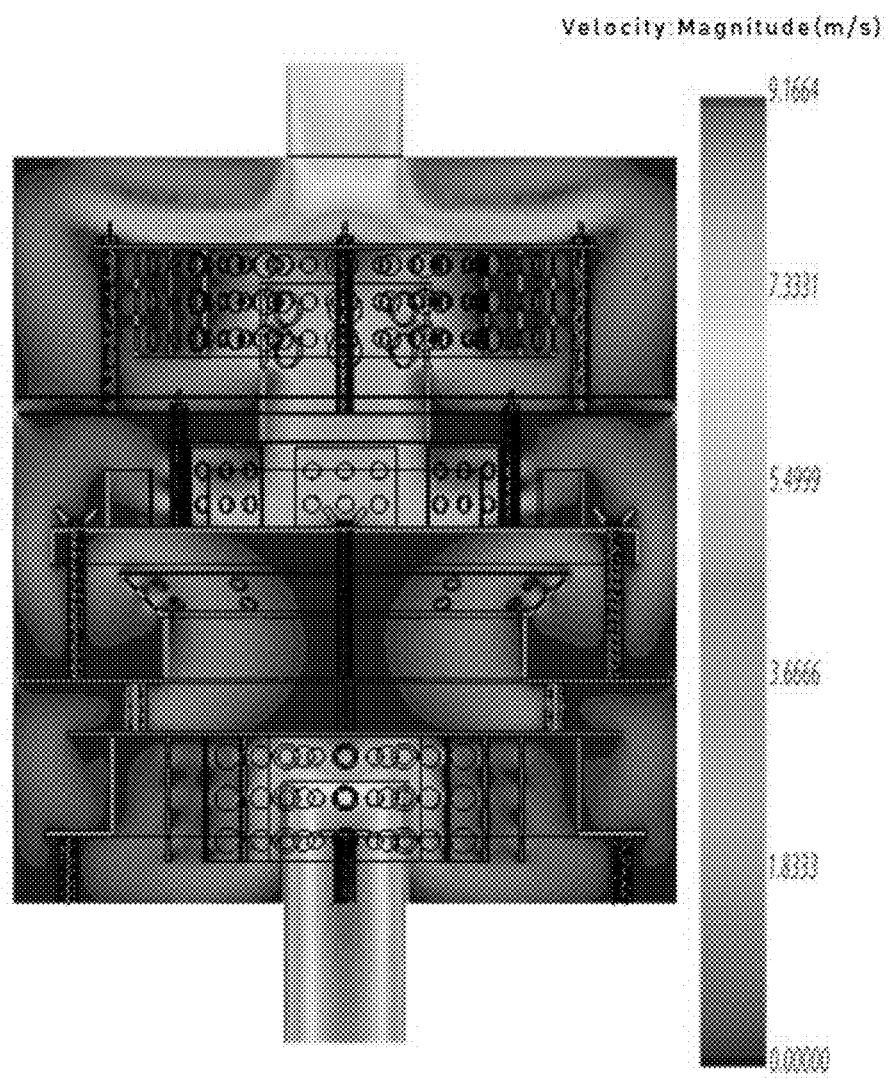
FIG. 12 is a view illustrating a flow velocity pattern in the apparatus for trapping a reaction by-product according to the embodiment of the present disclosure.

FIG. 10 is an exemplified view illustrating a trapping tendency in the apparatus for trapping a reaction by-product according to the embodiment of the present disclosure, FIG. 11 is an exemplified view illustrating a gas flow in the apparatus for trapping a reaction by-product according to the embodiment of the present disclosure, and FIG. 12 is a view illustrating a flow velocity pattern in the apparatus for trapping a reaction by-product according to the embodiment of the present disclosure.

FIG. 11A illustrates a reaction by-product trapping region, and FIG. 12B illustrates a gas flow path.

As illustrated, it can be seen that according to the apparatus for trapping a reaction by-product according to the present disclosure, the unreacted gas, which is introduced at a high flow velocity through the gas inlet port of the housing installed vertically, passes through the internal trapping tower including the first trapping structure, the second trapping structure, the third trapping structure, the fourth trapping structure, and the fifth trapping structure installed from above to below, the reaction by-product contained in the introduced unreacted gas is aggregated and trapped in the form of powder in the state in which the flow velocity is decreased by the multiple flow path switching structures, the multiple trapping structures, and the multiple stacking structures, and the gaseous unreacted gas is discharged at a high flow velocity through the gas discharge port.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for trapping a reaction by-product created by an etching process, the apparatus comprising:
an internal trapping tower (2) comprising:
a first trapping structure (21) configured to guide a flow of the unreacted gas, introduced from an upper side, downward to an outer periphery, trap and stack the reaction by-product, and trap the reaction by-product again multiple times at a lower side;
a second trapping structure (22) configured to guide the unreacted gas, introduced from the outer periphery, toward a central portion, move the unreacted gas downward, and trap and stack the reaction by-product together with the reaction by-product trapped at the lower side of the first trapping structure;
a third trapping structure (23) configured to guide the unreacted gas, introduced to the central portion, toward the outer periphery and trap and stack the reaction by-product multiple times;
a fourth trapping structure (24) configured to guide the unreacted gas, introduced from the outer periphery, toward the central portion, move the unreacted gas downward, and trap and stack the reaction by-product; and
a fifth trapping structure (25) configured to guide the unreacted gas, introduced to the central portion, downward through the outer periphery, trap and stack the reaction by-product, and trap the reaction by-product again multiple times at the lower side,
wherein the unreacted gas, introduced into a gas inlet port of the housing (1), flows toward the outer periphery or the central portion and sequentially flows downward, such that the reaction by-product is trapped and stacked, and
wherein the first trapping structure (21) comprises:
a trapping disc (211) configured to guide the flow of the unreacted gas to the outer periphery and trap the reaction by-product; and
a trapping cylinder part (212) installed on a lower surface of the trapping disc (211) and comprising a plurality of trapping cylinders (212a) disposed in multiple stages to serve as a filter for trapping the reaction by-product contained in the unreacted gas multiple times.

2. The apparatus of claim 1, wherein the first trapping structure (21), the second trapping structure (22), the third trapping structure (23), the fourth trapping structure (24), and the fifth trapping structure (25) are fastened by spacing members (213, 224, 235, and 254) so as to be vertically spaced apart from one another at predetermined intervals, and a support part (13b) is provided on an upper surface of a lower plate of the housing (1) and supports the fifth trapping structure (25) spaced apart from the lower plate of the housing (1) at a predetermined interval to support overall loads of the first to fourth trapping structures (21, 22, 23, and 24).

3. The apparatus of claim 1, wherein the plurality of trapping cylinders (212a) of the trapping cylinder part (212) has different diameters and is installed in multiple stages at predetermined intervals, the trapping cylinders (212a) each have a plurality of holes (212b) arranged in multiple stages around a peripheral surface thereof, the holes (212b) formed in the trapping cylinder (212a) positioned at an outermost periphery has the largest size, and the size of the hole decreases as the position of the trapping cylinder becomes closer to the inner side of the trapping cylinder part (212).

4. The apparatus of claim 1, wherein the second trapping structure (22) comprises:
a trapping disc (221) configured to guide the unreacted gas, introduced from the outer periphery, toward the central portion and trap and stack the reaction by-product;
a discharge tube (222) installed to vertically penetrate the central portion of the trapping disc and configured to discharge the unreacted gas downward while preventing a leakage of the trapped reaction by-product; and a flow path guide plate (223) installed around a lower end of the discharge tube and configured to block an upward flow of the discharged unreacted gas within a predetermined space region to improve trapping efficiency.

5. The apparatus of claim 4, wherein the trapping disc (221) is a circular disc having a diameter corresponding in size to an inner diameter of a housing main body constituting the housing and prevents the unreacted gas from flowing downward directly to the third trapping structure (23) at the lower side.

6. The apparatus of claim 4, wherein an upper portion of the discharge tube (222) protrudes to be positioned inside the trapping cylinder part (212) of the first trapping structure (21), a lower portion of the discharge tube (222) is positioned at an upper end of a trapping plate part of the third trapping structure (23), and a plurality of holes (222a) for introducing the unreacted gas is arranged in multiple stages around one section of the protruding upper portion of the discharge tube (222).

7. The apparatus of claim 1, wherein the third trapping structure (23) comprises:
a trapping disc (231) configured to guide the flow of the introduced unreacted gas toward the outer periphery, move the unreacted gas downward, and trap and stack the reaction by-product;
a trapping plate part (232) comprising a plurality of trapping plates (232a) having a plurality of holes (232b), circularly arranged on an upper surface of the trapping disc, and configured to allow the unreacted gas introduced from the upper side to remain, trap and stack the reaction by-product, and allow the unreacted gas to flow toward the outer periphery; and
a blocking wall part (233) configured to circularly surround an outer periphery of the trapping plate part, spaced apart from the trapping plate part at a predetermined interval, and configured to discharge the unreacted gas while preventing a leakage of the trapped reaction by-product.

8. The apparatus of claim 7, wherein the trapping disc (231) further comprises a flow path guide part (234) having a band shape, vertically protruding downward along a periphery of the trapping disc (231), and configured to guide a downward flow of the unreacted gas.

9. The apparatus of claim 7, wherein a height of the trapping plate part (232) is greater than a height of the blocking wall part (233).

10. The apparatus of claim 7, wherein the blocking wall part (233) comprises at least two or more blocking walls (223a) having no hole, circularly disposed, and spaced apart from one another at a predetermined interval.

11. The apparatus of claim 1, wherein the fourth trapping structure (24) comprises:
a trapping disc (241) configured to guide the unreacted gas, introduced from the outer periphery, toward the central portion and trap and stack the reaction by-product; and
a discharge tube (242) configured to penetrate upward the central portion of the trapping disc (241) and having an expanded tube portion (242a) provided at an upper portion thereof and configured to prevent a leakage of the trapped reaction by-product and discharge the unreacted gas downward.

12. The apparatus of claim 11, wherein the trapping disc (241) is a circular disc having a diameter corresponding in size to an inner diameter of a housing main body and prevents the unreacted gas from flowing downward directly to the fifth trapping structure (25).

13. The apparatus of claim 11, wherein the expanded tube portion (242a) has an oblique shape gradually inclined outward and upward and has a plurality of holes (242b) arranged in multiple stages around the expanded tube portion (242a) to guide a discharge and a flow of the unreacted gas.

14. The apparatus of claim 1, wherein the fifth trapping structure (25) comprises:
a trapping disc (251) configured to block a downward movement of the unreacted gas introduced to the central portion from the upper side, guide the downward flow of the unreacted gas through the outer periphery, discharge the unreacted gas so that the reaction by-product is trapped and stacked;
a gas receiving portion (252) provided in a peripheral direction on a lower surface of the trapping disc (251) and configured to guide a downward flow of the unreacted gas, introduce the unreacted gas into the gas receiving portion (252), and receive the unreacted gas; and
a trapping plate part (253) installed on a lower surface of the trapping disc (251), disposed inside the gas receiving portion (252), and comprising a plurality of trapping plates (253a) arranged in a quadrangular shape in multiple stages and having a plurality of holes (253b) to prevent a leakage of the introduced unreacted gas, trap the reaction by-product multiple times, and discharge only the unreacted gas to the gas discharge port (13 a).

15. The apparatus of claim 14, wherein a length of the gas receiving portion (252) protruding downward is shorter than a length of the trapping plate part (253), and a plurality of fastening parts (252a) is provided outward along a periphery of the gas receiving portion (252) and fastened to a support part (13b) protruding upward from a lower plate (13) of the housing (1).

16. The apparatus of claim 14, wherein the trapping plates (253a) of the trapping plate part (253) are arranged in a quadrangular shape and spaced apart from one another so that edges of the trapping plates (253a) are not attached to one another to allow the unreacted gas to be introduced therebetween, the hole (253b) formed in each of the trapping plates (253a) arranged in a quadrangular shape and disposed at an outermost periphery has the largest size, and the size of the hole (253b) decreases as the position of the trapping plates (253a) arranged in a quadrangular shape becomes closer to the inner side of the trapping plate part (253).

\* \* \* \* \*